(12) United States Patent
Yamazaki

(10) Patent No.: US 8,456,231 B2
(45) Date of Patent: Jun. 4, 2013

(54) FILTER CIRCUIT

(75) Inventor: Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/365,220

(22) Filed: Feb. 2, 2012

(65) Prior Publication Data

US 2012/0218035 A1    Aug. 30, 2012

(30) Foreign Application Priority Data

Feb. 25, 2011    (JP) .................................. 2011-040845

(51) Int. Cl.
*H03B 1/00* (2006.01)
*H03K 5/00* (2006.01)
*H04B 1/10* (2006.01)

(52) U.S. Cl.
USPC .......................................... 327/554; 327/558

(58) Field of Classification Search
USPC .......................................... 327/554, 558, 337
See application file for complete search history.

(56) References Cited

U.S. PATENT DOCUMENTS

| 5,245,344 A | 9/1993 | Sooch |
| 5,391,999 A * | 2/1995 | Early et al. ..................... 327/337 |
| 5,892,473 A | 4/1999 | Shin |
| 7,425,863 B2 * | 9/2008 | Gatta et al. ..................... 327/558 |
| 7,521,971 B2 | 4/2009 | Yamazaki |
| 7,777,663 B2 * | 8/2010 | Akizuki et al. ............... 341/172 |
| 7,906,998 B2 | 3/2011 | Yamazaki |
| 8,085,098 B2 | 12/2011 | Yamazaki |
| 2005/0116768 A1 * | 6/2005 | Sauerbrey ..................... 327/554 |
| 2011/0133800 A1 | 6/2011 | Yamazaki |

FOREIGN PATENT DOCUMENTS

| JP | 5-75471 A | 3/1993 |
| JP | 10-70466 A | 3/1998 |

OTHER PUBLICATIONS

U.S. Appl. No. 13/356,592, filed Jan. 23, 2012. Applicant: Yoshikazu Yamazaki.

* cited by examiner

*Primary Examiner* — Quan Tra
(74) *Attorney, Agent, or Firm* — Fitzpatrick, Cella, Harper & Scinto

(57) ABSTRACT

In a filter circuit comprising a plurality of low pass filters (LPFs) that are connected in series, each of the plurality of LPFs comprises a switched-capacitor circuit (SC), and a fully-differential amplifier (AMP) which amplifies a signal output from the SC, and outputs the amplified signal. An AMP of an LPF which inputs a signal output from a 1-bit digital-to-analog converter (DAC) comprises a discrete-time type common-mode feedback circuit, and an AMP of an LPF which outputs a signal output from the filter circuit comprises a continuous-time type common-mode feedback circuit.

7 Claims, 4 Drawing Sheets

FILTER CIRCUIT

BACKGROUND OF THE INVENTION

1. Field of the Invention

The present invention relates to a filter circuit and, more particularly, to a switched-capacitor filter circuit.

2. Description of the Related Art

In the audio field and various other communication fields, a digital-to-analog (D/A) converter is used to output an analog signal in response to input of a bit stream digital signal. An analog signal output from such a D/A converter is input to a low pass filter (LPF) formed using a switched capacitor and a differential amplifier. The analog signal input to the LPF is filtered to output the filtered signal as an analog signal having sufficiently reduced harmonics components.

Japanese Patent Laid-Open Nos. 5-075471 and 10-070466 (patent literatures 1 and 2) disclose the following configuration. That is, patent literatures 1 and 2 provide a filter circuit in which a 1-bit D/A converter in the foregoing stage is formed by a switched capacitor and a fully-differential amplifier and receives a bit stream digital signal, and a D/A converter in the subsequent stage is connected to an LPF formed by a switched capacitor and a fully-differential amplifier.

The fully-differential amplifier includes a common-mode feedback circuit (to be abbreviated as a CMFB circuit hereinafter) to stabilize the direct current (DC) level of an output. The CMFB circuit performs feedback so that the average voltage value of two signals output from the fully-differential amplifier becomes a predetermined voltage value. There are two types of CMFB circuits: continuous- and discrete-time type CMFB circuits. The continuous-time type CMFB circuit includes a feedback circuit which matches an average voltage value obtained by dividing the two output signals by the resistances with a predetermined voltage value.

A fully-differential amplifier which uses a switched-capacitor circuit typically employs a discrete-time type CMFB circuit. The discrete-time type CMFB circuit performs feedback discretely by, for example, alternately sampling two output signals and predetermined voltage values into a capacitor. However, patent literatures 1 and 2 give no details of the configuration of the CMFB circuit in the fully-differential amplifier.

SUMMARY OF THE INVENTION

In one aspect, a filter circuit which comprises a plurality of low pass filters that are connected in series, and outputs an output signal in response to an input signal, each of the plurality of low pass filters comprising a switched-capacitor circuit which inputs a signal, and a fully-differential amplifier which amplifies a signal output from the switched-capacitor circuit, and outputs the amplified signal, wherein a fully-differential amplifier of a first low pass filter which receives the input signal comprises a discrete-time type common-mode feedback circuit, and a fully-differential amplifier of a second low pass filter which outputs the output signal comprises a continuous-time type common-mode feedback circuit.

According to this aspect, it is possible to obtain a filter circuit excellent in distortion characteristics. It is also possible to obtain a filter circuit which generates less switching noise.

Further features of the present invention will become apparent from the following description of exemplary embodiments with reference to the attached drawings.

DESCRIPTION OF THE EMBODIMENTS

A filer circuit according to an embodiment of the present invention will be described in detail below with reference to the accompanying drawings.

First Embodiment

The configuration of a filter circuit according to the first embodiment will be described with reference to a block diagram shown in FIG. 1.

Figure 1:
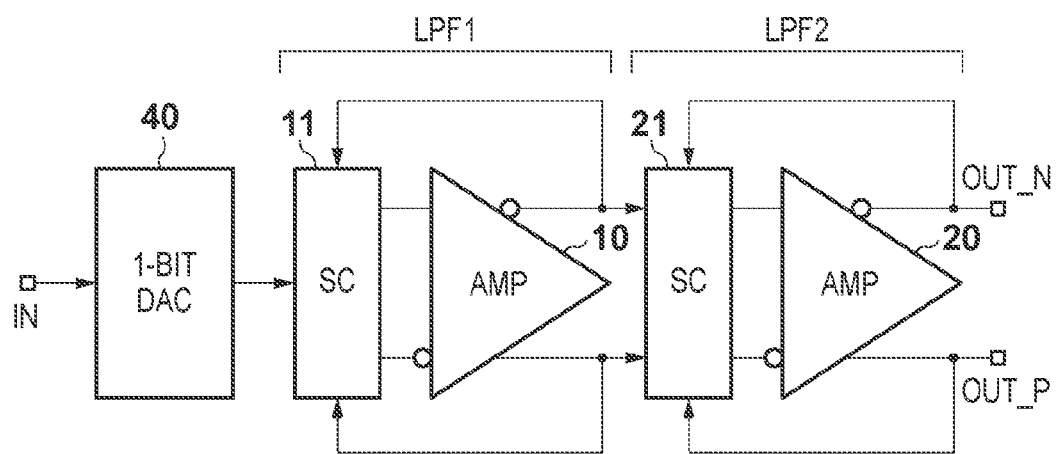
FIG. 1 is a block diagram for explaining the configuration of a filter circuit according to the first embodiment.

A switched-capacitor filter circuit according to the first embodiment shown in FIG. 1 includes two low pass filters (LPFs) that are connected in series with a 1-bit digital-to-analog converter (1-bit DAC) 40. The first low pass filter (LPF1) includes a switched-capacitor circuit (SC) 11 and fully-differential amplifier (AMP) 10, and the second low pass filter (LPF2) includes an SC 21 and AMP 20.

In each LPF, an output from the SC is input to a non-inverting input terminal (to be referred to as a +IN terminal hereinafter) and an inverting input terminal (to be referred to as a −IN terminal hereinafter) of the AMP. Further, to feed back an output from the AMP to the SC, a first output terminal (that serves as a positive output terminal and will be referred to as an OUT_P terminal hereinafter) of the AMP, and a second output terminal (that serves as a negative output terminal and will be referred to as an OUT_N terminal hereinafter) of the AMP, which outputs a signal obtained by inverting a signal from the OUT_P terminal, are connected to the SC.

An output from LPF1 (an output from the AMP 10) is input to the SC 21 of LPF2. Note that each SC includes pluralities of analog switches and capacitors.

The operations of the D/A converter and filter circuit will be described next. When the 1-bit DAC 40 inputs a digital bit stream input signal, it outputs one of two different reference voltages to the SC 11. For example, if the input signal is at high level '1', the 1-bit DAC 40 outputs a first reference voltage Vref1; or if the input signal is at low level '0', the 1-bit DAC 40 outputs a second reference voltage Vref2 (≠Vref1).

The SC 11 stores charges based on the signal output from the 1-bit DAC 40. The AMP 10 amplifies a voltage corresponding to the amount of charges stored in the SC 11, and outputs the amplified voltage to the SC 21. The SC 21 stores charges based on the signal output from the AMP 10. The AMP 20 amplifies a voltage corresponding to the amount of charges stored in the SC 21, and outputs the amplified voltage to its OUT_P terminal and OUT_N terminal.

Each SC periodically, alternately opens/closes an analog switch connected to the charging electrode of the capacitor, and an analog switch connected to the discharging electrode of the capacitor, thereby charging/discharging the capacitor. This causes charge migration, so a pulsed current flows. When the operating clock frequency of each analog switch is sufficiently high, the capacitor can be regarded as a resistance. The higher the frequency, and the higher the capacitance of the capacitor, the lower the resistance value of the capacitor regarded as a resistance becomes. This resistance value and the capacitor connected between the input and output of the AMP form an LPF. This LPF can filter a digital bit stream input signal, and output an analog signal having reduced harmonics components.

The capacitor of the SC 11 is charged from a voltage source having the reference voltage Vref1 or Vref2 corresponding to an input signal. For this reason, a signal input to the AMP 10 suffers a considerable voltage fluctuation every time the analog switches of the SC 11 open/close, so a voltage output from the AMP 10 considerably fluctuates as well. Therefore, when a continuous-time type common-mode feedback circuit (CMFB circuit) is used in the AMP 10, an output from the AMP 10 is always fed back with a considerable fluctuation in output voltage, so the operating voltage range of the AMP 10 widens, thus degrading the distortion characteristics. In other words, when a discrete-time type CMFB circuit is used, a fluctuation in voltage output from the AMP 10 can be reduced.

Also, when a continuous-time type CMFB circuit is used in the AMP 20, an adverse effect of switching noise on the output signal experienced upon use of a discrete-time type CMFB circuit can be reduced. A signal input to the AMP 20 is a signal having passed through LPF1, and therefore suffers a voltage fluctuation smaller than that of a signal input to the AMP 10, every time the analog switches open/close. Therefore, the AMP 20 preferably uses a continuous-time type CMFB circuit which generates only low switching noise in an output signal.

In this manner, it is effective to use a discrete-time type CMFB circuit in the AMP 10 to improve the distortion characteristics, and to use a continuous-time type CMFB circuit in the AMP 20 to reduce switching noise. The switched-capacitor filter circuit according to the first embodiment uses a fully-differential amplifier including a discrete-time type CMFB circuit as the AMP 10 of LPF1, and uses a fully-differential amplifier including a continuous-time type CMFB circuit as the AMP 20 of LPF2. This makes it possible to obtain a filter circuit which is excellent in distortion characteristics and generates less switching noise.

Second Embodiment

A filter circuit according to the second embodiment of the present invention will be described below. Note that the same reference numerals as in the first embodiment denote the same configurations in the second embodiment, and a detailed description thereof will not be given.

The configuration of the filter circuit according to the second embodiment will be described with reference to a block diagram shown in FIG. 2. The filter circuit shown in FIG. 2 includes a D/A converter different from that in the first embodiment in that in the former the OUT_P terminal and OUT_N terminal of an AMP 20 are connected to an SC 11.

The operations of the D/A converter and filter circuit shown in FIG. 2 will be described. The SC 11 and an AMP 10 store charges based on a signal output from a 1-bit DAC 40, and that output from the AMP 20, amplify voltages corresponding to the amounts of stored charges, and output the amplified voltages to an SC 21. Such a configuration can be used to form, for example, a Butterworth filter or a Chebyshev filter.

Figure 2:
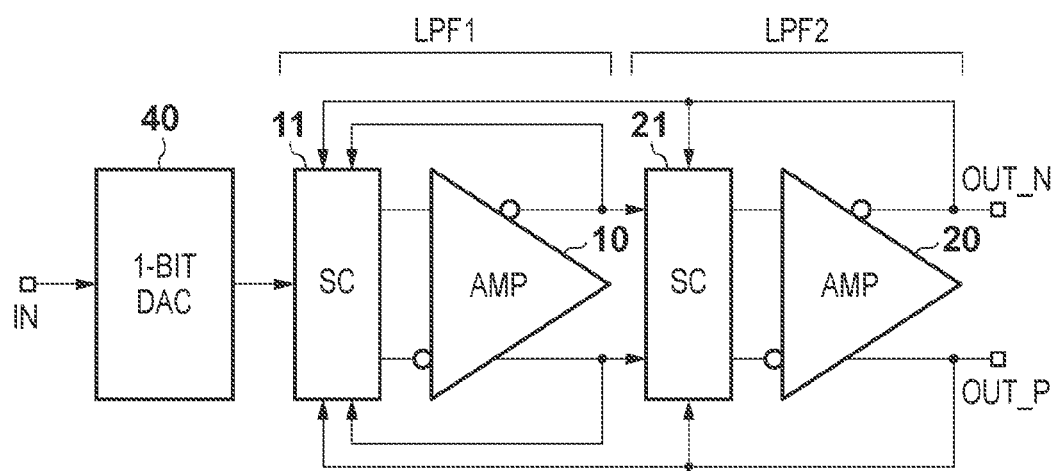
FIG. 2 is a block diagram for explaining the configuration of a filter circuit according to the second embodiment.

In the configuration shown in FIG. 2, it is effective to use a discrete-time type CMFB circuit in the AMP 10 to improve the distortion characteristics, and to use a continuous-time type CMFB circuit in the AMP 20 to reduce switching noise, as in the first embodiment. The switched-capacitor filter circuit according to the second embodiment uses a fully-differential amplifier including a discrete-time type CMFB circuit as the AMP 10 of LPF1, and uses a fully-differential amplifier including a continuous-time type CMFB circuit as the AMP 20 of LPF2. This makes it possible to obtain a filter circuit which is excellent in distortion characteristics and generates less switching noise.

Third Embodiment

A filter circuit according to the third embodiment of the present invention will be described below. Note that the same reference numerals as in the first or second embodiment denote the same configurations in the third embodiment, and a detailed description thereof will not be given.

Although a switched-capacitor filter circuit including two series-connected LPFs has been described in the first and second embodiments, a switched-capacitor filter circuit including three series-connected LPFs will be described in the third embodiment.

The configuration of the filter circuit according to the third embodiment will be described with reference to a block diagram shown in FIG. 3. That is, the filter circuit according to the third embodiment includes a third low pass filter (LPF3) between LPF1 and LPF2 used in the second embodiment.

The input of an SC 11 is connected to the output of a 1-bit DAC 40, the OUT_P terminal and OUT_N terminal of an AMP 10, and the OUT_P terminal and OUT_N terminal of an AMP 30. Also, the input of an SC 31 is connected to the OUT_P terminal and OUT_N terminal of the AMP 10, the OUT_P terminal and OUT_N terminal of the AMP 30, and the OUT_P terminal and OUT_N terminal of an AMP 20. Moreover, the input of an SC 21 is connected to the OUT_P terminal and OUT_N terminal of the AMP 30, and the OUT_P terminal and OUT_N terminal of the AMP 20.

The operation of the filter circuit shown in FIG. 3 will be described. The SC 11 and AMP 10 store charges based on a signal output from the 1-bit DAC 40, and that output from the AMP 30, amplify voltages corresponding to the amounts of stored charges, and output the amplified voltages to the SC 31. The SC 31 and AMP 30 store charges based on a signal output from the AMP 10, and that output from the AMP 20, amplify voltages corresponding to the amounts of stored charges, and output the amplified voltages to the SC 21. The SC 21 and AMP 20 store charges based on a signal output from the AMP 30, amplify voltages corresponding to the amounts of stored charges, and output the amplified voltages.

Figure 3:
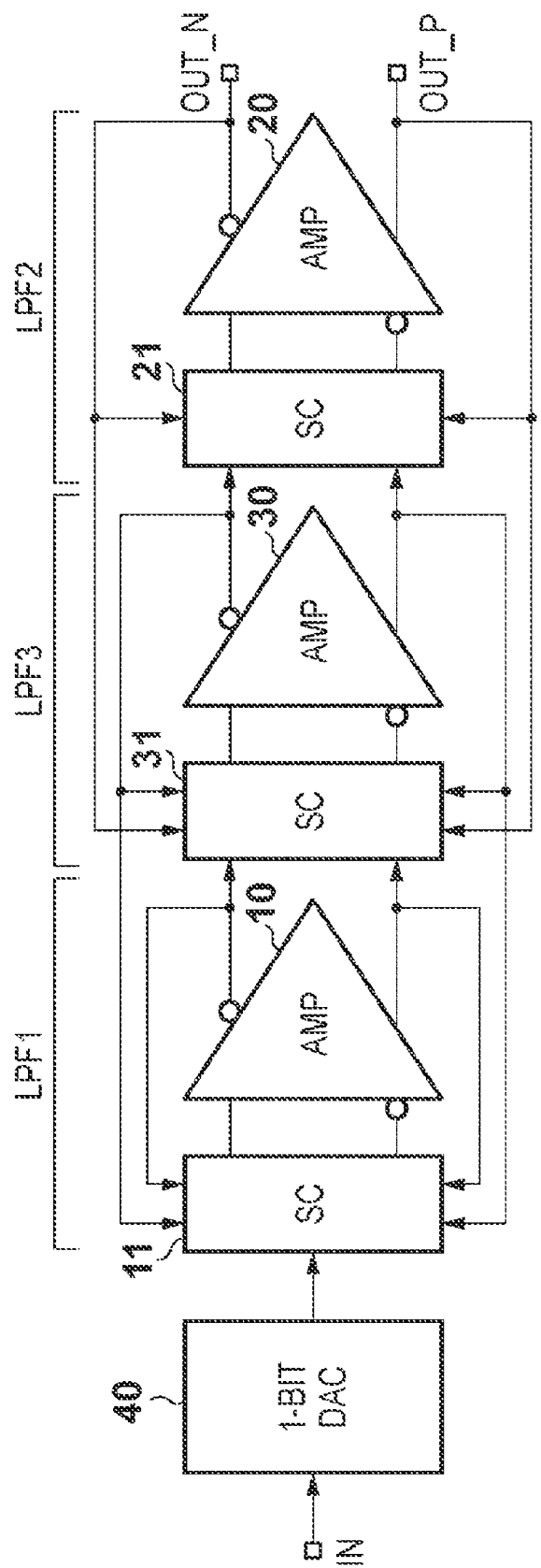
FIG. 3 is a block diagram for explaining the configuration of a filter circuit according to the third embodiment.

In the configuration shown in FIG. 3, signals input to the AMPs 10 and 30 suffer considerable voltage fluctuations every time analog switches open/close, so voltages output from the AMPs 10 and 30 considerably fluctuate as well. Therefore, to improve the distortion characteristics, it is effective to use discrete-time type CMFB circuits in the AMPs 10 and 30. Also, to reduce switching noise, it is effective to use a continuous-time type CMFB circuit in the AMP 20, as in the first and second embodiments.

The switched-capacitor filter circuit according to the third embodiment uses a fully-differential amplifier including a discrete-time type CMFB circuit as each of the AMP 10 of LPF1 and the AMP 30 of LPF3. Also, this switched-capacitor filter circuit uses a fully-differential amplifier including a continuous-time type CMFB circuit as the AMP 20 of LPF2. This makes it possible to obtain a filter circuit which is excellent in distortion characteristics and generates less switching noise.

Although a configuration in which LPF3 is arranged between LPF1 and LPF2 has been described above, a plurality of LPFs including discrete-time type CMFB circuits may be connected in series between LPF1 and LPF2. This means that at least one LPF can be arranged between LPF1 and LPF2. In this case, a differential output signal from LPF2 is fed back to the SC of one of the LPFs arranged between LPF1 and LPF2.

Figure 4:
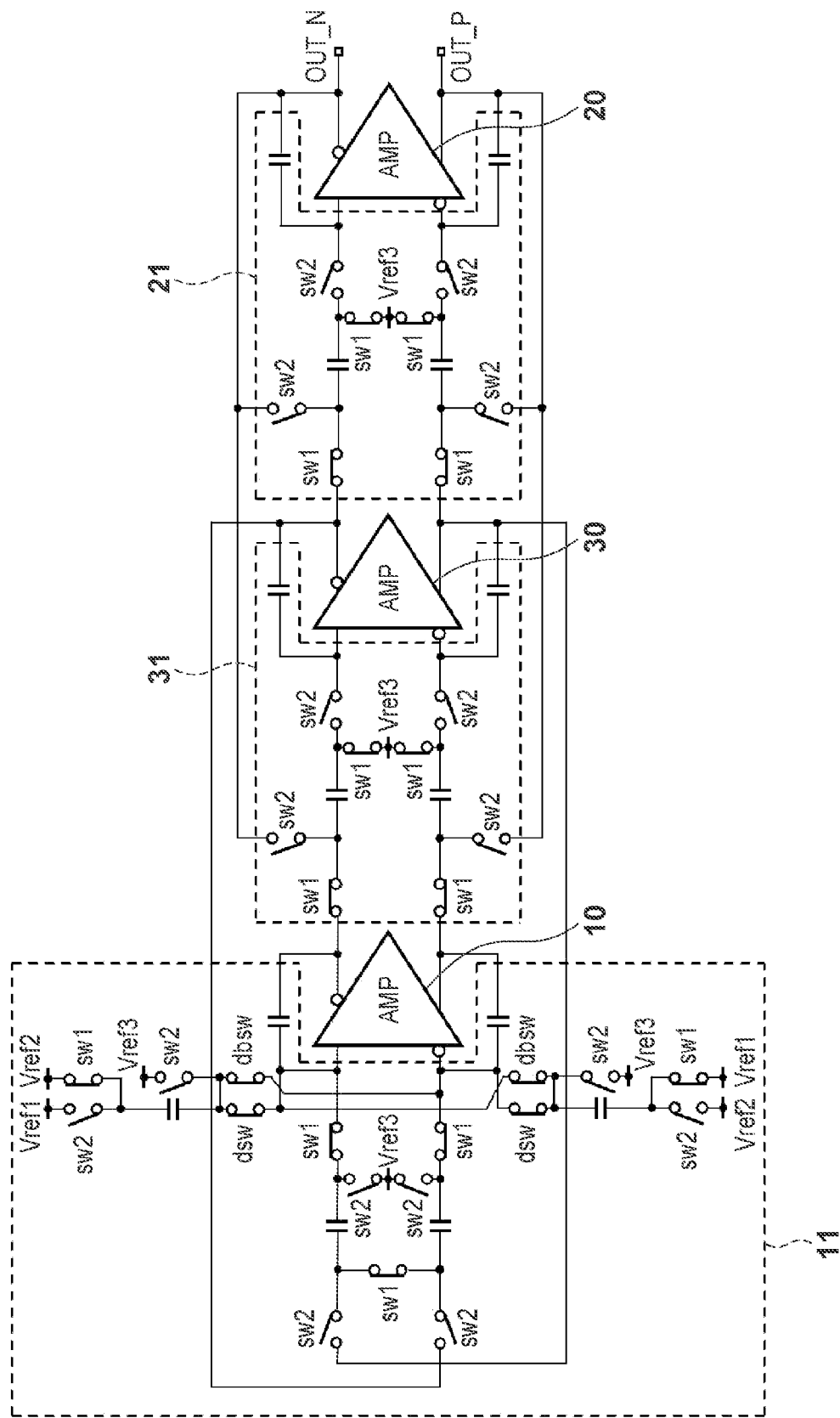
FIG. 4 is a circuit diagram for explaining the configuration of the filter circuit according to the third embodiment.

The more detailed circuit configuration of the filter circuit according to this embodiment will be described. The same reference numerals as in FIG. 3 denote elements corresponding to the configuration shown in FIG. 3. Referring to FIG. 4, each switched-capacitor circuit includes a plurality of capacitors and a plurality of switches. Reference symbols assigned to the plurality of switches denote signals which control opening/closing of the corresponding switches.

An SC 11 includes a path to which an output from an AMP 10 is provided as an input signal, a path to which an output from an AMP 20 is provided as an input signal, and a plurality of switches controlled in accordance with control signals sw1, sw2, dsw, and dswb. Among these signals, the control signal dsw is at high level when the output from the 1-bit DAC shown in FIG. 3 is at high level and the control signal sw1 is at high level. Also, the control signal dswb is at high level when the output from the 1-bit DAC is at low level and the control signal sw2 is at high level.

An SC 21 includes a path through which an output from the fully-differential amplifier 20 is fed back to the input terminal of the fully-differential amplifier 20 via a feedback capacitor, and a path to which outputs from the fully-differential amplifiers 20 and 30 are selectively provided as input signals.

An SC 31 includes a path through which an output from a fully-differential amplifier 30 is fed back to the input terminal of the fully-differential amplifier 30 via a capacitor (feedback capacitor) arranged in a feedback path, and a path to which outputs from the fully-differential amplifiers 30 and 20 are selectively provided as input signals.

Figure 5:
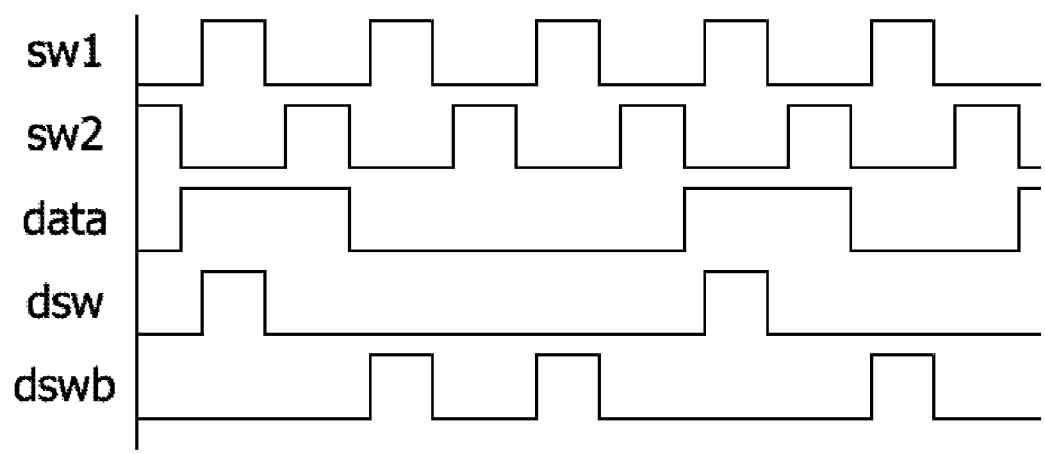
FIG. 5 is a timing chart for explaining the operation of the filter circuit according to the third embodiment.

The operation of the filter circuit shown in FIG. 4 will be described next with reference to a timing chart shown in FIG. 5. Each switch is turned on when the corresponding control signal changes to high level, and is turned off when this signal changes to low level. "data" indicates a digital signal input to the 1-bit DAC.

The control signals sw1 and sw2 are alternately provided to the filter circuit so their high or low levels do not coincide with each other. When the digital signal "data" is at high level, the control signals sw1 and sw2 are alternately input so that the SC 11 transfers a voltage (Vref1−Vref3) to the +IN terminal of the fully-differential amplifier 10 with reference to the second reference voltage Vref2. Again, when the digital signal "data" is at high level, the control signals sw1 and sw2 are alternately input so that the SC 11 transfers a voltage (Vref3−Vref2) to the −IN terminal of the fully-differential amplifier 10 with reference to the first reference voltage Vref1. In this case, the reference voltage Vref3 is different from the first reference voltages Vref1 and Vref2.

On the other hand, when the digital signal "data" is at low level, the control signals sw1 and sw2 are alternately input so that the SC 11 transfers a voltage (Vref3−Vref2) to the +IN terminal of the fully-differential amplifier 10 with reference to the first reference voltage Vref1. Again, when the digital signal "data" is at low level, the control signals sw1 and sw2 are alternately input so that the SC 11 transfers a voltage (Vref1−Vref3) to the +IN terminal of the fully-differential amplifier 10 with reference to the second reference voltage Vref2.

The SC 21 receives outputs from the fully-differential amplifiers 30 and 20 as input signals based on the control signals sw1 and sw2.

Also, the SC 31 receives outputs from the fully-differential amplifiers 10 and 30 as input signals based on the control signals sw1 and sw2.

Note that the above-described embodiments merely provide specific examples when the present invention is practiced, and should not be construed as limiting the technical scope of the present invention. That is, the present invention can be practiced in various forms without departing from the technical idea or main feature of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-040845, filed Feb. 25, 2011, which is hereby incorporated by reference herein in its entirety.

What is claimed is:

1. A filter circuit which comprises a plurality of low pass filters that are connected in series, and outputs an output signal in response to an input signal,
   each of the plurality of low pass filters comprising a switched-capacitor circuit which inputs a signal, and a fully-differential amplifier which amplifies a signal output from the switched-capacitor circuit, and outputs the amplified signal,
   wherein a fully-differential amplifier of a first low pass filter which receives the input signal comprises a discrete-time type common-mode feedback circuit, and
   a fully-differential amplifier of a second low pass filter which outputs the output signal comprises a continuous-time type common-mode feedback circuit.

2. The filter circuit according to claim 1, wherein differential output signals from the fully-differential amplifiers of the plurality of low pass filters, respectively, are input to the switched-capacitor circuits of the corresponding low pass filters.

3. The filter circuit according to claim 1, wherein a differential output signal from the fully-differential amplifier of the second low pass filter is input to a switched-capacitor circuit of the first low pass filter.

4. The filter circuit according to claim 1, wherein at least one low pass filter in which the common-mode feedback circuit comprises a discrete-time type fully-amplifier is connected in series between the first low pass filter and the second low pass filter.

5. The filter circuit according to claim 4, wherein a differential output signal from the fully-differential amplifier of the second low pass filter is input to a switched-capacitor circuit of one of the at least one low pass filter.

6. The filter circuit according to claim 1, wherein a third low pass filter in which the common-mode feedback circuit comprises a discrete-time type fully-differential amplifier is connected in series between the first low pass filter and the second low pass filter,
   wherein a differential output signal from the fully-differential amplifier of the third low pass filter is input to a switched-capacitor circuit of the first low pass filter, and
   wherein a differential output signal from the fully-differential amplifier of the second low pass filter is input to a switched-capacitor circuit of the third low pass filter.

7. The filter circuit according to claim 1, wherein the input signal includes an output from a 1-bit digital-to-analog converter.

* * * * *